(12) United States Patent
Hosono et al.

(10) Patent No.: US 6,807,099 B2
(45) Date of Patent: Oct. 19, 2004

(54) SEMICONDUCTOR MEMORY DEVICE

(75) Inventors: Koji Hosono, Kanagawa (JP); Hiroshi Nakamura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 44 days.

(21) Appl. No.: 10/345,030

(22) Filed: Jan. 14, 2003

(65) Prior Publication Data

US 2003/0133326 A1 Jul. 17, 2003

(30) Foreign Application Priority Data

Jan. 16, 2002 (JP) ......................................... 2002-006847

(51) Int. Cl.[7] .............................................. G11C 16/04
(52) U.S. Cl. ............................ 365/185.19; 365/185.23; 365/185.18
(58) Field of Search ....................... 365/185.19, 185.23, 365/185.18, 230.06, 189.11, 189.06

(56) References Cited

U.S. PATENT DOCUMENTS 6,097,630 A * 8/2000 Kobatake ................ 365/185.18

2001/0054737 A1 12/2001 Nakamura et al.

FOREIGN PATENT DOCUMENTS

JP 2000-285690 10/2000

* cited by examiner

*Primary Examiner*—David Lam
(74) *Attorney, Agent, or Firm*—Hogan & Hartson, LLP

(57) ABSTRACT

A semiconductor memory device disclosed herein comprises a memory cell array in which memory cells are connected to word lines, a first voltage generating circuit which generates a first voltage, a second voltage generating circuit which generates a second voltage using the first voltage, a word line selecting circuit which selects at least one of the word lines, a word line voltage supplying circuit which supplies the second voltage to the selected word line through the word line selecting circuit, and a transfer voltage supplying circuit which supplies the first voltage to the word line selecting circuit and stops supplying it to be in a floating state before transferring the second voltage from the word line voltage supplying circuit to the selected word line, in an operation in which the second voltage is supplied to the selected word line after the first voltage is supplied to the word line selecting circuit.

10 Claims, 15 Drawing Sheets

SEMICONDUCTOR MEMORY DEVICE

CROSS REFERENCE TO RELATED APPLICATION

This application claims benefit of priority under 35 U.S.C. §119 to Japanese Patent Application No. 2002-6847, filed on Jan. 16, 2002, the entire contents of which are incorporated by reference herein.

BACKGROUND OF THE INVENTION

1. Field of the Invention

The present invention relates to an electrically programmable semiconductor memory device, and particularly relates to a semiconductor memory device in which a program control operation is performed.

2. Description of the Related Art

As shown in FIG. 11, a related semiconductor memory device includes a block decoder 10, voltage supply circuit CG drivers 6, a VPP pump circuit 30, a VPASS pump circuit 40, and a VRDEC driver 150. The VRDEC driver 150 shown in FIG. 12 has NMOS D-type transistors 152 connected in series, and a voltage VPGMH is inputted to gates of the transistors 152 via a level shifter 151. A voltage VPGMH is inputted to their one end, and a control signal VRDEC is outputted from the other end side. Moreover, NMOS D-type transistors 154 connected in series are provided between the control signal VRDEC and a voltage VDD, and a control signal VRDEC_V is inputted to gates of the transistors 154 via an inverter 153.

A memory region includes, for example, NAND-type flash memory cells. In FIG. 11, a top-bottom direction is a row direction, and a left-right direction is a column direction. The number of memory cells in the row and column directions is set properly according to memory capacity.

FIG. 13 shows the voltages of some nodes in this semiconductor memory device as program operation waveforms. At a time t0, a block is selected by an inputted address, and the VRDEC driver 150 outputs the voltage VPGMH to the row decoder in response to the control signal VRDEC_V. Namely, when the signal VRDEC_V goes to the voltage VDD at the time t0, an output of the control signal VRDEC starts to rise from the voltage VDD to the voltage VPGMH, that is, 20 V+Vtn. Program data is outputted to bit lines BL0 to BLi from a sense amplifier 50, a selection gate SGD (SG2) on the bit line side is driven to the voltage VDD, and the program data is inputted to the selected NAND-type cell.

If a program voltage VPGM and a program intermediate voltage VPASS are transferred from the voltage supply circuit CG drivers 6 to their respective word lines CG0 to CG15 at a time t1, a program operation is executed by the program data sent from the bit lines BL0 to BLi. In this case, the program intermediate voltage VPASS (10 V in FIG. 13) is used not only to turn on memory cells (non-selected cells) in the non-selected word lines between the selection gate and the selected memory cell and transfer the program data from the bit line to the selected memory cell but also to generate a non-program voltage in channels in the NAND cell so as not to bring about a threshold voltage shift to the selected memory cell.

Incidentally, in a circuit configuration shown in FIG. 11, when the supply of the voltage VPGM starts at the time t1, the level of the voltage VPGMH for transferring the program voltage VPGM by transfer transistors 3 is lowered by parasitic capacitance of a path for transferring the voltage VPGM and word line capacitance. As the capability of the VPP pump circuit 30 is lower and the load of the VPGM transfer path is larger, this tendency becomes stronger. On this occasion, the voltage VPGM is generated so as to become a voltage lower than the voltage VPGMH by a threshold voltage of an NMOS transistor 25 at an output part of the VPP PUMP 30, and hence it operates together while having at least a difference Vtn corresponding to the threshold voltage of the NMOS transistor 25. Accordingly, when a voltage with the same voltage as the voltage VPGMH is transferred to gates Transfer G of the transfer transistors 3 in the selected row decoder, as shown by (A) in FIG. 13, a voltage of 20 V+Vtn is transferred to the gates Transfer G of the transfer transistors 3, whereby 20 V can be transferred to the selected word line.

Next, FIG. 14 shows the circuit configuration of a level shifter 2 in the block row decoder 10. A D-type NMOS transistor 90 is provided, and the control signal VRDEC of 20 V+α is inputted to a source of the transistor 90. The gates Transfer G of the transfer transistors 3 are connected to a gate of this NMOS transistor 90. A PMOS transistor 91 is connected to a drain of the D-type NMOS transistor 90, and an output 2 of a decoder is connected to a gate of the transistor 91. An NMOS transistor 92 is connected to a drain of the PMOS transistor 91, and the voltage VDD is inputted to a gate of the transistor 92. An output 1 of the decoder is inputted to a source of the NMOS transistor 92.

When the block decoder including this level shifter is selected, the output 1 of the decoder becomes the voltage VDD, and the output 2 of the decoder becomes 0 V. Therefore, the NMOS transistor 92 is cut off after transferring a voltage VDD-Vtn to the gate Transfer G, the D-type NMOS transistor 90 transfers a voltage corresponding to the gate Transfer G to a well and a source of the PMOS transistor 91, and then the PMOS transistor 91 is turned on. Consequently, the voltage transferred by the NMOS D-type transistor 90 is transferred to the gate Transfer G via the PMOS transistor 91 turned on. By this voltage, the NMOS D-type transistor 90 transfers a higher voltage. As stated above, positive feedback is given between Transfer G and the transistors 90 and 91, whereby the voltage to be applied to VRDEC is applied as shown by an arrow in FIG. 14.

In the aforementioned related semiconductor memory device, the following problems arise. Due to a problem in terms of an operation margin, a case where the voltage of VPGMH cannot be fully transferred to the gates Transfer G of the transfer transistors 3 as shown in a waveform C1 in FIG. 13 may occur.

The relation between the threshold voltage of the NMOS D-type transistor 90 and current amount in the level shifter 2 is shown now in FIG. 15. As the voltage is applied to its source, the threshold voltage becomes larger by back gate bias effect. When back gate bias characteristics greatly deteriorate for some reason as in a case 2 although characteristics of a case 1 is assumed at the time of the application of a back gate bias of 20 V+Vtn at the beginning of a circuit design, that is, it is assumed that the NMOS D-type transistor is in an ON state until it transfers VPGMH, the voltage shown in FIG. 14 which the level shifter can transfer lowers greatly.

On this occasion, in terms of a DC operation, after the level shifter is charged to a voltage such as shown by a waveform C1 shown by a broken line in FIG. 13, the gates Transfer G of the transfer transistors 3 become floating. When the voltage of the voltage VPGMH to which the control signal VRDEC is charged lowers as stated above since the program voltage VPGM (20 V) is transferred to the word line at the time t1, the voltage of the gates Transfer G of the transfer transistors 3 lowers concurrently therewith, and the gates Transfer G of the transfer transistors 3 are biased in terms of DC until a time tf. Since the gates Transfer G of the transfer transistors 3 become floating after the time tf, the voltage of the gates Transfer G of the transfer transistors 3 slightly rises by coupling effect even after the time tf by contribution of the program voltage VPGM and the program intermediate voltage PASS in the middle of activation, and a waveform C2 is obtained. The voltage of the waveform C2 is higher than the voltage of the waveform C1, but unless it rises to 20 V+Vtn which is the voltage of VPGMH, the voltage to be transferred to the selected word line becomes a low voltage shown by the waveform C2, and hence the predetermined voltage VPGM (20 V) cannot be transferred. Namely, the program voltage VPGM cannot be completely transferred.

In a normal state, the waveform of voltage of the transfer gates is shown by A, and corresponds to the voltage of the waveform VPGMH. The voltage VPGMH is a voltage obtained by adding the threshold voltage of the transfer gate to the program voltage of 20 V to be applied to the selected word line, and hence the program voltage of 20 V is transferred to the word line without any problem under normal circumstances. More specifically, in the related VRDEC driver circuit 150, by maintaining the control signal VRDEC_V at "H" level from the beginning to the end of a program operation during the program operation and outputting the voltage VPGMH to the gates of the NMOS D-type transistors 152 from the level shifter 151 in the VRDEC driver circuit 150, the VRDEC driver circuit 150 continues outputting the voltage VPGMH. Therefore, if the level of the fundamental voltage VPGMH of the VPP pump circuit 30 lowers when the program voltage VPGM is transferred to the word line, the voltage VPGMH whose level has lowered is also transferred as it is to the control signal VRDEC.

In such a case, the desired program voltage cannot be sometimes applied to the word line of the memory cell under the influence of the problem of the level shifter in terms of the operation margin.

SUMMARY OF THE INVENTION

In order to accomplish the aforementioned and other objects, according to one aspect of the present invention, a semiconductor memory device, comprises;

a memory cell array in which electrically programmable memory cells are arranged in a matrix form, the memory cells being connected to word lines;

a first voltage generating circuit which generates a first voltage;

a second voltage generating circuit which generates a second voltage using the first voltage, the second voltage being lower than the first voltage;

a word line selecting circuit which selects at least one of the word lines of the memory cells in accordance with an inputted address;

a word line voltage supplying circuit which supplies the second voltage to the selected word line through the word line selecting circuit; and a transfer voltage supplying circuit which supplies the first voltage to the word line selecting circuit and stops supplying the first voltage so as to be in a floating state before transferring the second voltage from the word line voltage supplying circuit to the selected word line, in an operation in which the second voltage is supplied to the selected word line after the first voltage is supplied to the word line selecting circuit.

DETAILED DESCRIPTION OF THE EMBODIMENTS

First Embodiment

Figure 1:
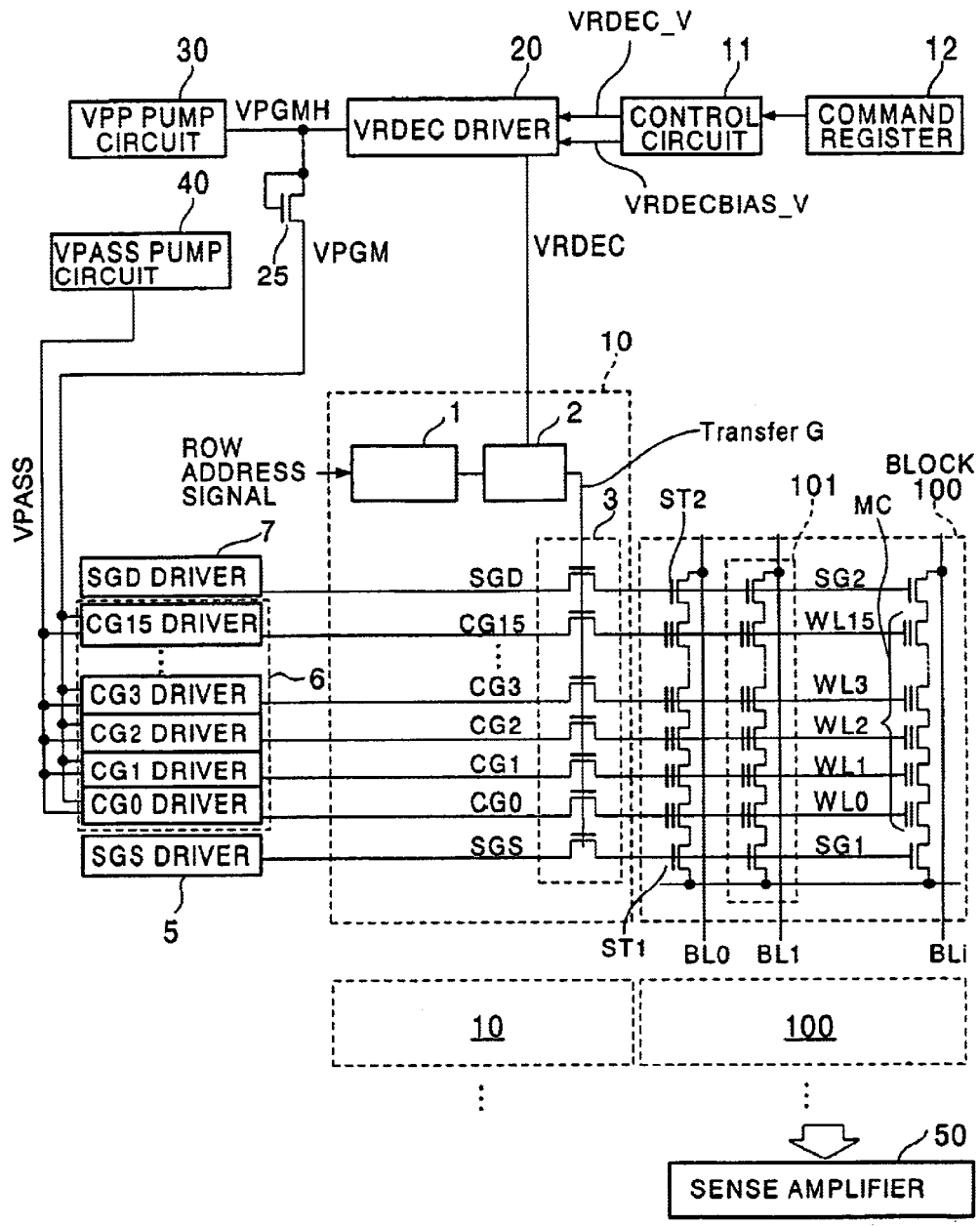
FIG. 1 is a block diagram showing a semiconductor memory device of a first embodiment.

As a semiconductor memory device of this embodiment, a NAND-type flash memory will be explained as one of electrically programmable nonvolatile memories. FIG. 1 shows the connection relationship among a part of its memory cell array, a row decoder, and a sense amplifier. A NAND-type cell 101 which is a basic component of the memory cell array includes a selection transistor ST2 on the side of each of bit lines BL0 to BLi (i is an integer equal to or larger than 0), a selection transistor ST1 on the side of a common source line CELSRC, and memory cells MC connected in series between the two selection transistors ST1 and ST2. In other words, the memory cells MC are arranged in a matrix form in the memory cell array. The NAND-type cells 101 are arranged so as to share word lines WL0 to WL15 and selection gate lines SG1 and SG2 and form a block 100. In actual fact, a plurality of blocks 100 are arranged in the memory cell array in this embodiment.

The bit lines BL0 to BLi connected to respective NAND-type cells are connected to a sense amplifier 50. The sense amplifier 50 includes latch circuits for temporarily hold data read from the bit lines, and these latch circuits perform the function of holding data to be programmed into the memory cells. A row decoder 10 includes a decoder 1 for selecting a block by an inputted address, a plurality of transfer transistors 3 for transferring predetermined word line voltages and selection gate voltages, and a level shifter 2 for outputting a predetermined voltage to gates of the transfer transistors 3. A row address signal is inputted to the decoder 1. In actual fact, since one row decoder 10 is provided for each of the blocks 100, the row decoder 10 is a block decoder. In other words, a plurality of row decoders 10 are provided in the memory cell array and each of the row decoders 10 corresponds to one of the blocks 100. To output predetermined voltages to respective word lines and selection gate lines in the NAND-type cell, an SGS driver 5 is connected to the selection gate line SG1, an SGD driver 7 is connected to the selection gate line SG2, and CG drivers 6 are connected to the word lines, respectively via the transfer transistors 3. Moreover, the level shifter 2 has a circuit configuration shown in FIG. 14 described above.

Figure 2:
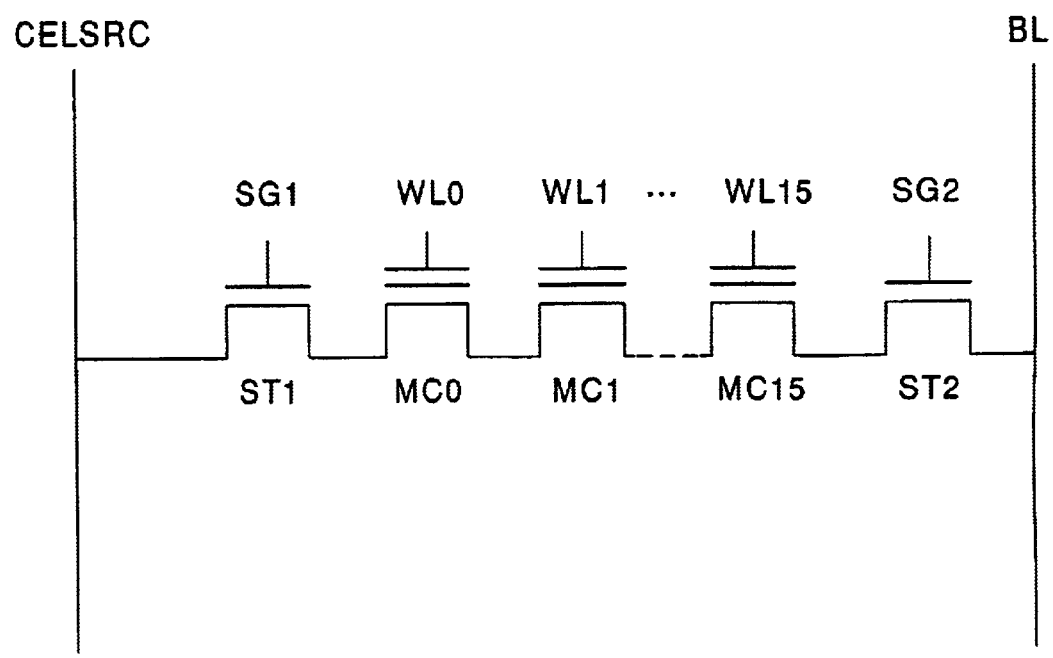
FIG. 2 is a circuit diagram showing a memory cell array of the semiconductor memory device of the first embodiment.

A program operation for the NAND-type memory cell will be explained now by means of FIG. 2. When the program operation with a memory cell threshold voltage shift is executed, the bit line BL is set at 0V. When a voltage VDD of 2.5 V is applied to a gate of the selection transistor ST2, the selection gate ST2 is turned on, 10 V is applied to respective gates of the memory cells MC0 and MC2 to MC15 into which data is not programmed, and 20 V is applied to a gate of the memory cell MC 1 into which data is to be programmed, and thus the respective memory cells are tuned on. Although a voltage of 1 V to 2 V is applied to a CELSRC signal line, 0 V is applied to a gate of the selection transistor ST1, and hence the selection transistor ST1 is cut off. Since a voltage of 0 V is transferred from the bit line to the memory cell MC1 via the selection gate ST2 and the memory cells MC2 to MC15, in the memory cell MC1, a voltage difference of 20 V occurs between its gate and its channel. Accordingly, electrons are injected into the floating gate, and hence data is programmed thereinto. Since an intermediate voltage of 10 V is applied to the respective gates of the memory cells MC0 and MC2 to MC15, data is not programmed into these memory cells.

On the other hand, when the program operation without the threshold voltage shift is performed, the bit line BL is set at the voltage VDD (2.5V). In this case, after transferring a voltage of 2.5V–Vt (Vt is a threshold voltage of the selection transistor ST2) into the NAND-type cell, the selection transistor ST2 is cut off. Accordingly, when the intermediate voltage of 10 V is applied to the gates of the memory cells MC0 and MC2 to MC15 and 20 V is applied to the gate of the memory cell MC1, the voltages of all channels in the NAND-type cell brought into a floating state rise to a voltage higher than 2.5 V–Vt by coupling. Consequently, a voltage difference which does not cause an FN (Fowler-Nordheim) tunnel current is applied between the gate and the channel of the selected memory cell MC1, whereby no threshold voltage shift occurs.

A VPP pump circuit 30 in FIG. 1 generates a voltage VPGMH which is higher than a program voltage VPGM. A VRDEC driver circuit 20 supplies the voltage VPGMH to gates Transfer G of the transfer transistors 3 via the level shifter circuit 2 of the selected row decoder 10. The VRDEC driver circuit 20 is controlled by a control signal VRDEC_V and a control signal VRDECBIAS_V from a control circuit 11. This control circuit 11 is controlled by a signal from a command register 12 which receives and holds a program operation command.

A VPASS pump circuit 40 generates a program intermediate voltage to be transferred to non-selected word lines in the block 100 selected in the program operation.

The output voltage VPGMH of the VPP pump circuit 30 is connected to a drain of a diode-connected voltage drop transistor 25, and the voltage VPGM which is dropped by the threshold voltage of the transistor 25 is outputted to voltage supply circuit CG drivers 6. In this case, it is desirable that the voltage difference between the voltage VPGM and the voltage VPGMH is equal to or higher than the threshold voltage of the transfer transistor 3. Program data is inputted to the respective bit lines BL0 to BLi from the sense amplifier 50. The sense amplifier 50 includes the latch circuits for temporarily holding read data and program data.

These VPP pump circuit 30, VRDEC driver circuit 20, VPASS pump circuit 40, SGD driver circuit 7, SGS driver circuit 5, voltage drop transistor 25, and voltage supply circuit CG driver circuits 6 are provided in common to the respective blocks.

Figure 3:
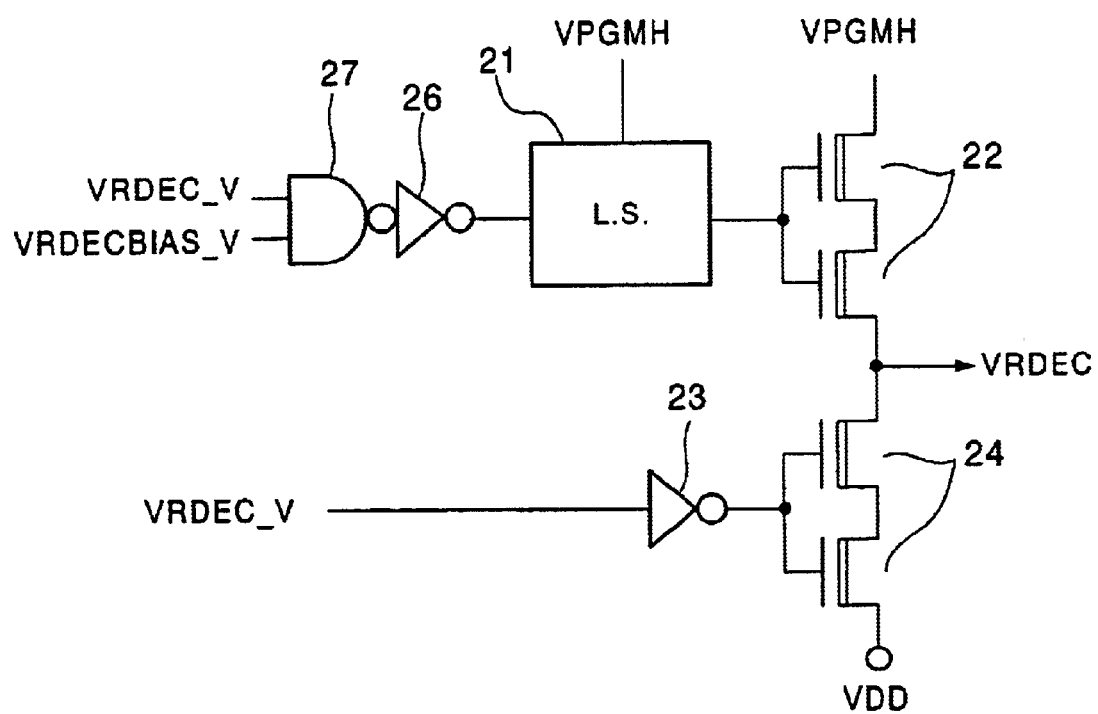
FIG. 3 is a circuit diagram showing the configuration of a VRDEC driver circuit of the semiconductor memory device of the first embodiment.

The VRDEC driver circuit 20 is shown now in FIG. 3. The VRDEC_V signal and the VRDECBIAS_V signal are inputted to a NAND circuit 27. An output of this NAND circuit 27 is inputted to an inverter 26. An output of this inverter 26 is inputted to a level shifter 21. A VPGMH signal is also inputted to this level shifter 21. An output of the level shifter 21 is inputted to gates of two NMOS D-type transistors 22 which are connected in series between the VPGMH signal and a VRDEC signal. Further, an inverter 23 to which a control signal VRDEC_V is inputted is provided. An output of this inverter 23 is inputted to gates of two NMOS D-type transistors 24 which are connected in series between the voltage VDD and the VRDEC signal.

Figure 4:
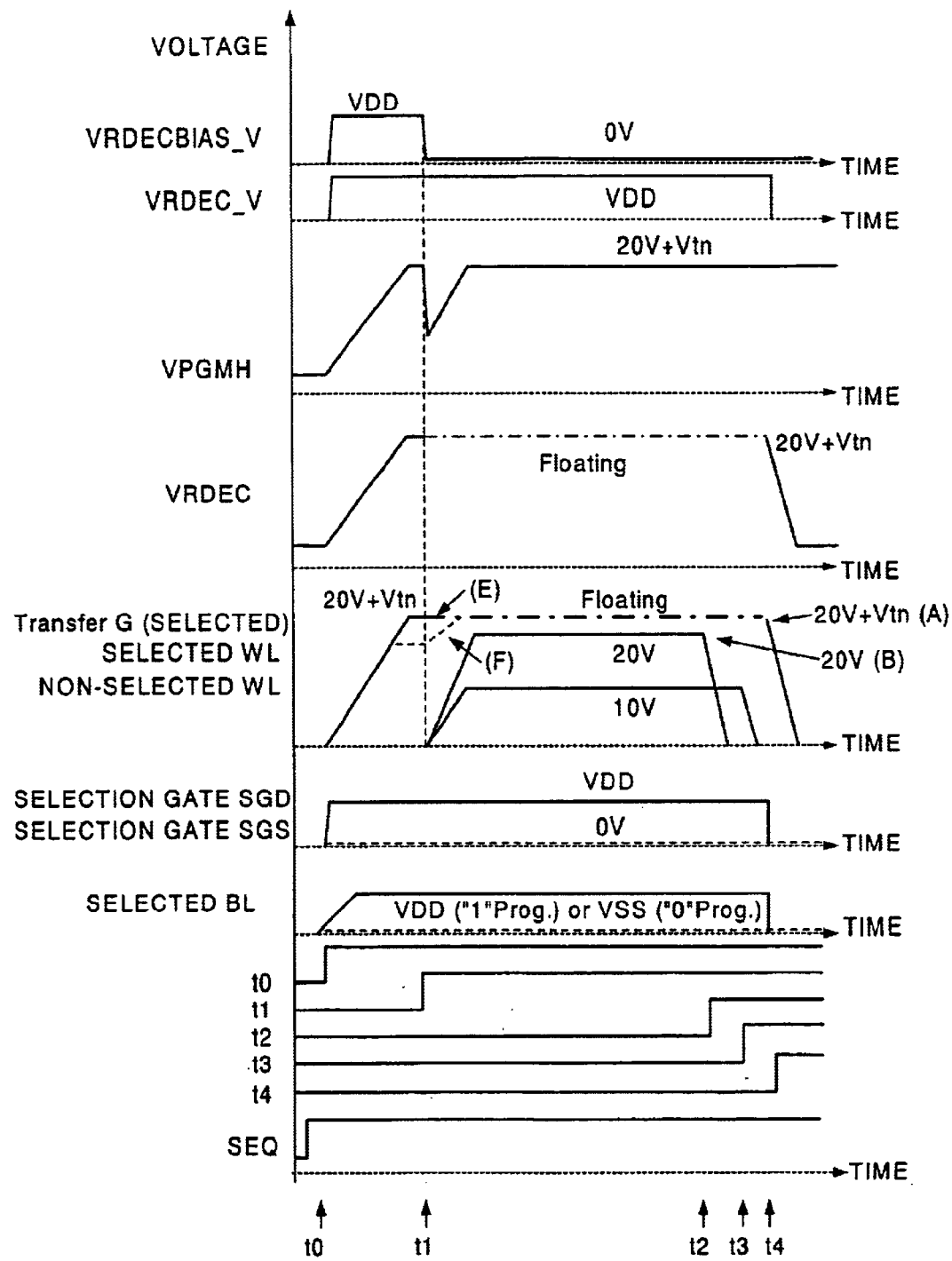
FIG. 4 is a timing chart showing a program operation of the semiconductor memory device of the first embodiment.

In the circuit in FIG. 3, an AND logic output of the control signals VRDEC_V and VRDECBIAS_V is inputted to the level sifter 21. FIG. 4 shows waveforms in the normal program operation using this VRDEC driver. The waveform of the control signal VRDEC_V is as in a related art, but the control signal VRDECBIAS_V goes to "L" level at a time t1 when the signal VPGM is applied to the word line. Hence, at the time t1, an output of the level shifter 21 is discharged from the voltage VPGMH, whereby the NMOS D-type transistors 22 are cut off. Consequently, an output of the VRDEC is brought into a floating state from the time t1. The time t1 is, for example, approximately 5 $\mu$-seconds after a time t0. On this occasion, a waveform E in FIG. 4 is obtained when the level shifter 2 of the row decoder 10 transfers the same voltage as that of the control signal VRDEC, whereas a waveform F is obtained when the level shifter 2 of the row decoder 10 has no operation margin so that it cannot transfer the same voltage as that of the control signal VRDEC. The voltage of the waveform F at the time t1 is insufficient to transfer the voltage VPGM, but thereafter, by activation of the control signals VPGM and VPSS to be applied to the word lines, a sufficient voltage to transfer the program voltage VPGM can be obtained by coupling effect between the CG lines, the word lines and the gates of the transfer transistors 3 from the voltage at the time when the floating state has started.

Figure 14:
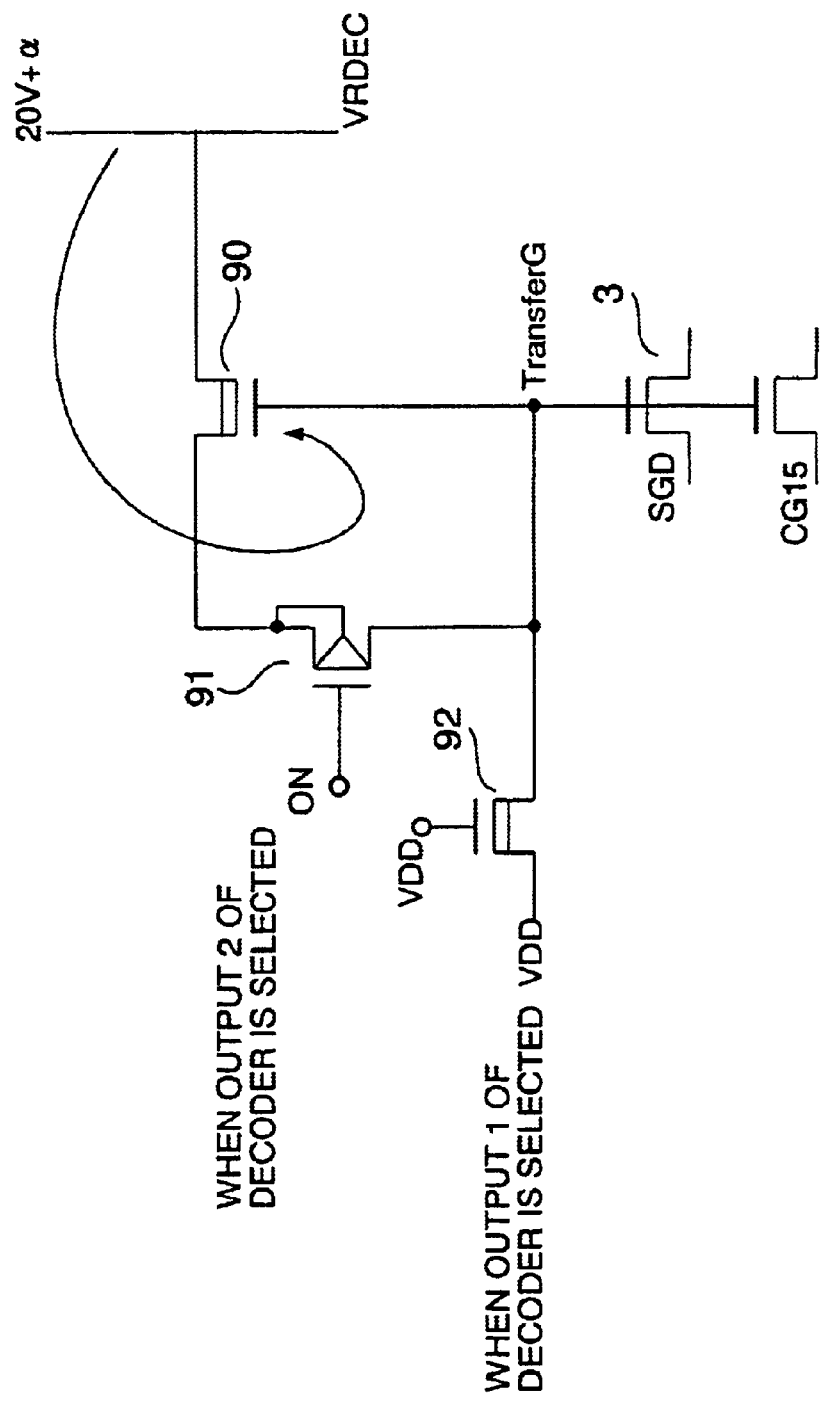
FIG. 14 is a circuit diagram showing the configuration of a level shifter of the related semiconductor memory device.
Figure 15:
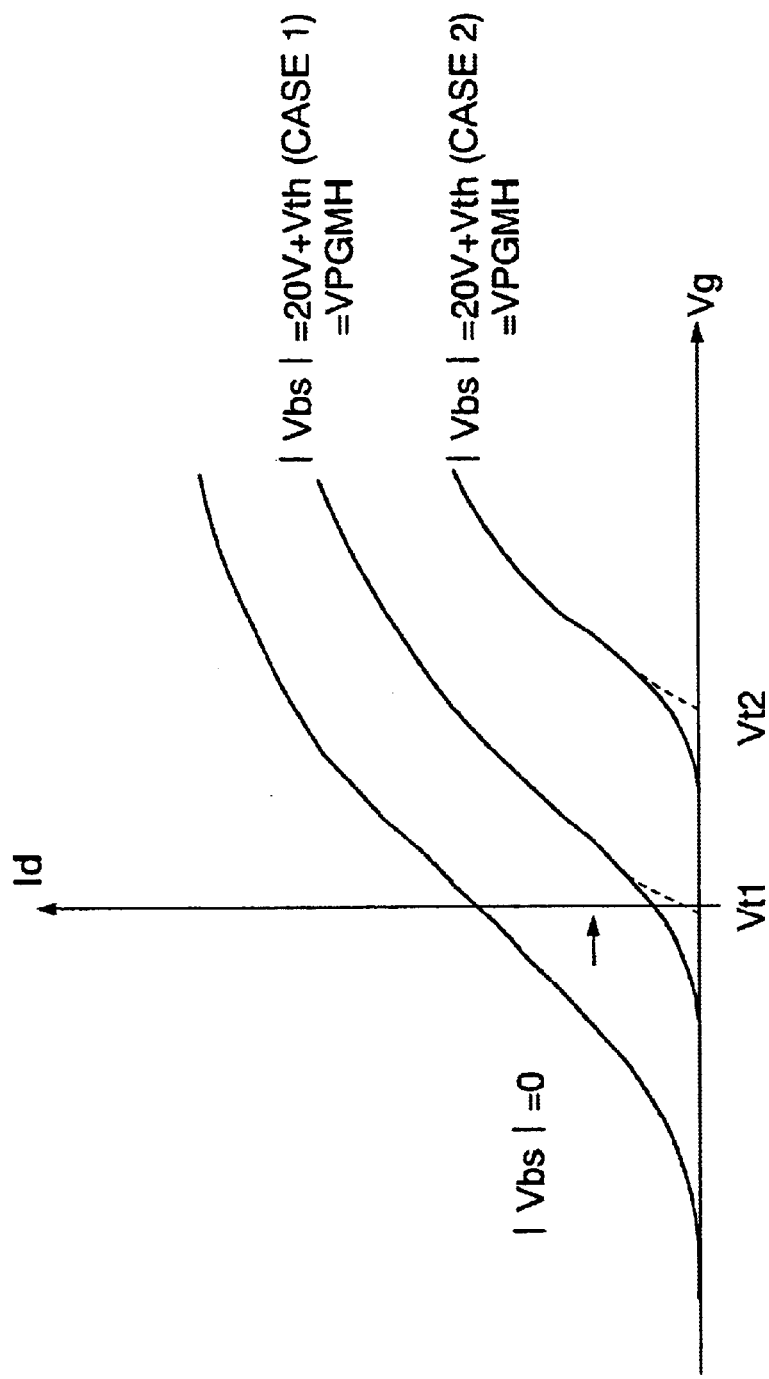
FIG. 15 is a voltage-current characteristic diagram showing the relation between the threshold voltage of a transistor and current amount in a circuit of the level shifter of the related semiconductor memory device.

When the same voltage as the voltage VRDEC can be transferred to the gates Transfer G of the transfer transistors 3 by the time t1 as shown by the waveform E, the voltage of the gates Transfer G of the transfer transistors 3 becomes almost the same as that of the floating signal VRDEC even if the coupling effect from the CG lines and the word lines is received. At this time, the parasitic capacitance of the floating signal VRDEC is larger than the capacitance of the gates Transfer G of the transfer transistors 3 of the selected block, whereby it is maintained at an almost constant floating voltage since it was brought to the floating state at the time t1. 20 V+Vtn in FIG. 4 is the voltage of the transfer G, and 20 V(B) is the voltage of the word line. Strictly speaking, the voltage of the transfer G is determined by transistor characteristics in the level shift circuit 2. When the level shift circuit 2 includes a circuit such as shown in FIG. 14, and the Vg-Id characteristic of the NMOS D-type transistor 90 therein is as in a case 2, the voltage of the transfer G can be higher than VRDEC by approximately a threshold voltage Vt2 at the time of the application of a back gate bias. Therefore, a difference between the voltage of the VRDEC and the voltage of the gates Transfer G of the transfer transistors 3 is equal to or lower than the threshold voltage Vt2 of the NMOS D-type transistor 90.

At a time t2, the word line voltage of 20 V starts to be discharged. This time t2 is, for example, approximately 20 $\mu$-seconds. Then, at a time t3, the voltage of the non-selected word lines starts to be discharged from 10 V. This time 3 is, for example, approximately about 22 $\mu$-seconds. Subsequently, at a time t4, the gate voltage starts to be discharged from 20 V+Vtn. This time t4 is, for example, approximately 24 $\mu$-seconds. The selected bit line BL is at the voltage VDD level when "1" is programmed and at Vss level when "0" is programmed.

Figure 5A:
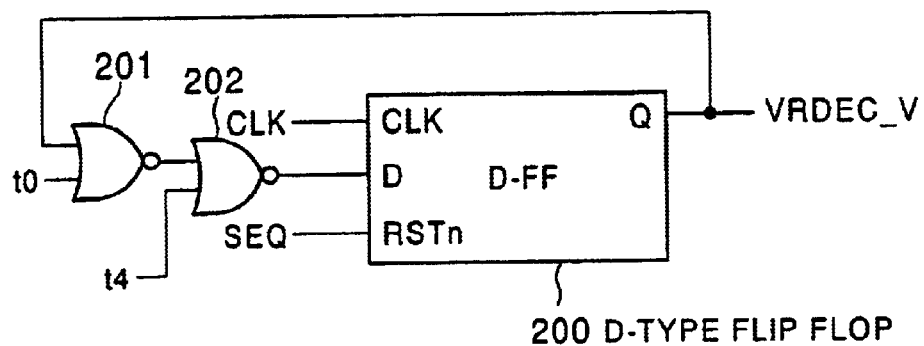
FIG. 5A is a logic circuit diagram showing the configuration of a VRDEC_V control circuit of the semiconductor memory device of the first embodiment.

The selection gates SGD and SGS have the voltage VDD and 0 V respectively at a time t0, and become 0 V at the time t4. FIG. 5A shows an example of a circuit for controlling the signal VRDEC_V. This circuit includes a D-FF circuit 200 and NOR circuits 201 and 202. A control signal SEQ is a signal which goes to "H" level during the program operation and when the program operation is not performed, goes to "L" level to bring the control signal VRDEC_V into a reset state ("L" level output). Here, t0 and t4 are each a signal indicating the time, and at respective times, the level changes from "L" level to "H" level (see FIG. 4). Accordingly, as shown in FIG. 4, the control signal VRDEC_V starts a shift to "H" level at the time t0 and starts a shift to "L" level at the time t4.

Figure 5B:
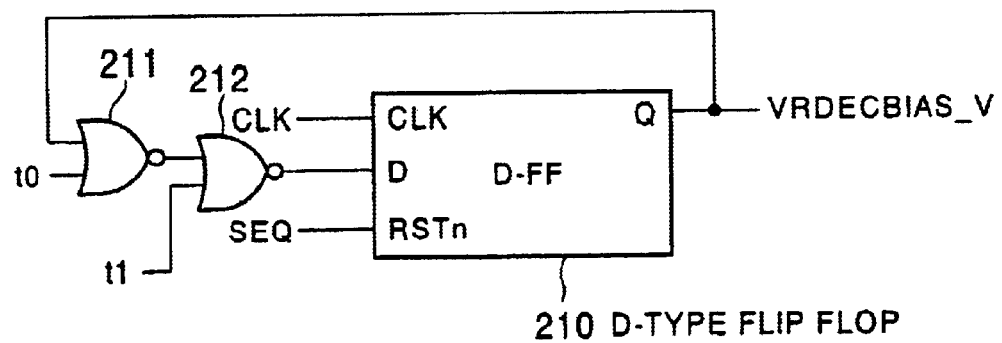
FIG. 5B is a logic circuit diagram showing the configuration of a VRDECBIAS_V control circuit of the semiconductor memory device of the first embodiment.

FIG. 5B shows an example of a circuit for controlling the signal VRDECBIAS_V. The configuration of this circuit is the same as the VRDEC_V control circuit shown in FIG. 5A. In order to change the control signal VRDECBIAS_V to an "L" level output at the time t1 as shown in FIG. 4, a signal t1 is inputted to the NOR circuit 212. By such control circuits, the control signal VRDEC_V and the control signal VRDECBIAS_V are outputted to realize operation control such as shown in FIG. 4.

Figure 6:
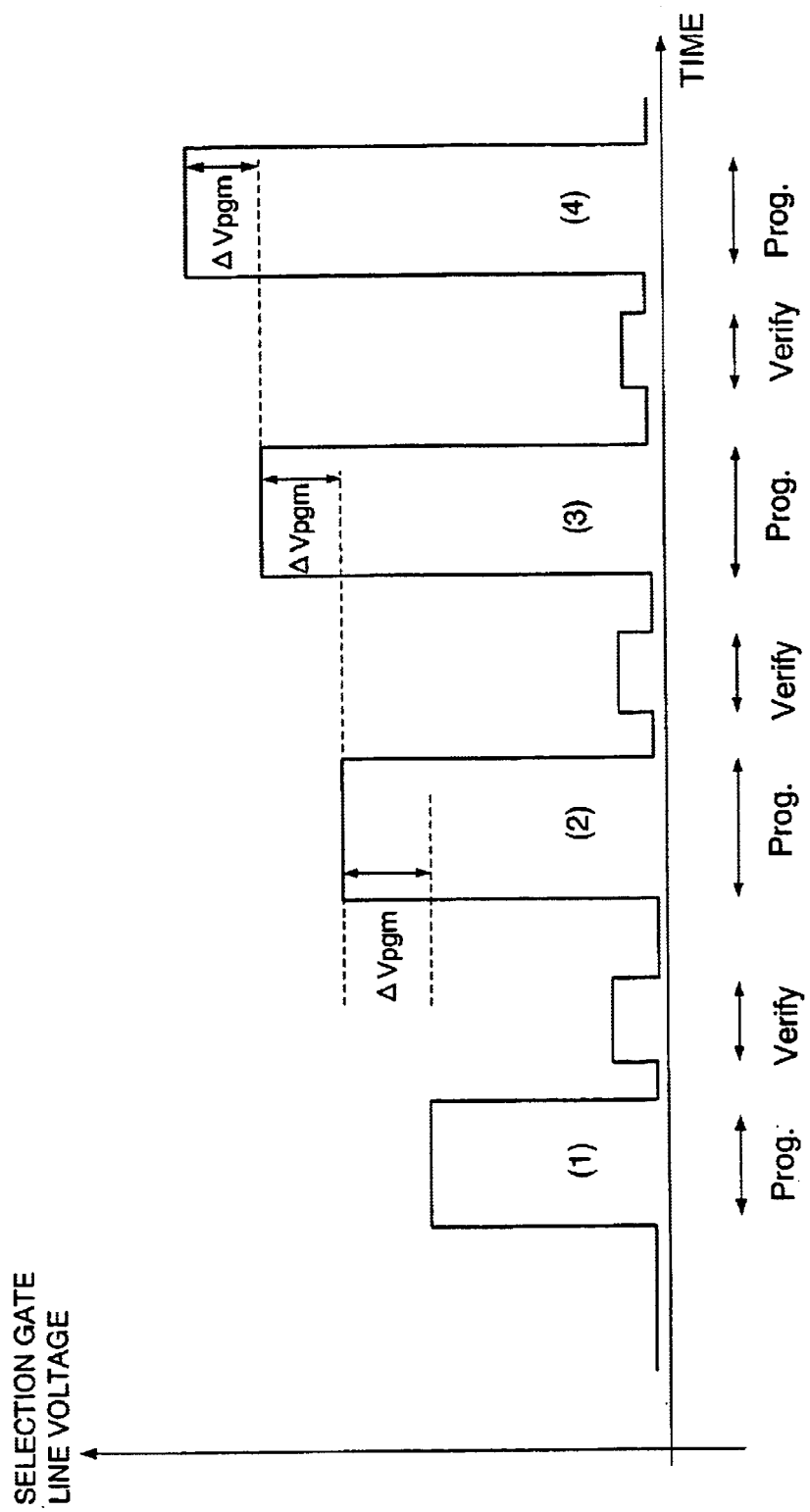
FIG. 6 is a voltage change diagram showing changes in program/read voltages with respect to time of the semiconductor memory device of the first embodiment.

Although the above explanation is given with the program voltage as 20 V, in the actual program operation of an NAND-type flash memory, the operation of applying the program voltage and the verify read operation are repeated as shown in FIG. 6. The program voltage is gradually increased every time.

In the first program operation, the lowest program voltage is applied as shown by (1). Thereafter, the verify operation is performed. When desired data is not programmed correctly after this first verify operation, a voltage higher than the first program voltage by $\Delta$Vpgm is applied to perform the second program operation. Subsequently, the second verify operation is performed. Thereafter, when desired data is not programmed correctly, a voltage higher than the second program voltage by $\Delta$Vpgm is applied to perform the third program operation. The third verify operation is then performed. In the normal program operation, approximately five program operations and five verify operations are repeated, and the program voltage increases in each operation. As measures against variations in program characteristics of memory cells and deterioration in program characteristics, it is effective as a control method to increase the program voltage as described above, and hence it is indispensable to be able to transfer the desired program voltage to the word line in a wide range.

If the threshold voltage of the transistor in the level shifter in the row decoder greatly changes for some reason and thereby the desired voltage is not transferred to the transfer gates Transfer G, the desired program voltage cannot be applied to the word line (gate) of the memory cell to which data is to be programmed. The configuration such as in this embodiment can prevent the margin from being eliminated as stated above.

Figure 7:
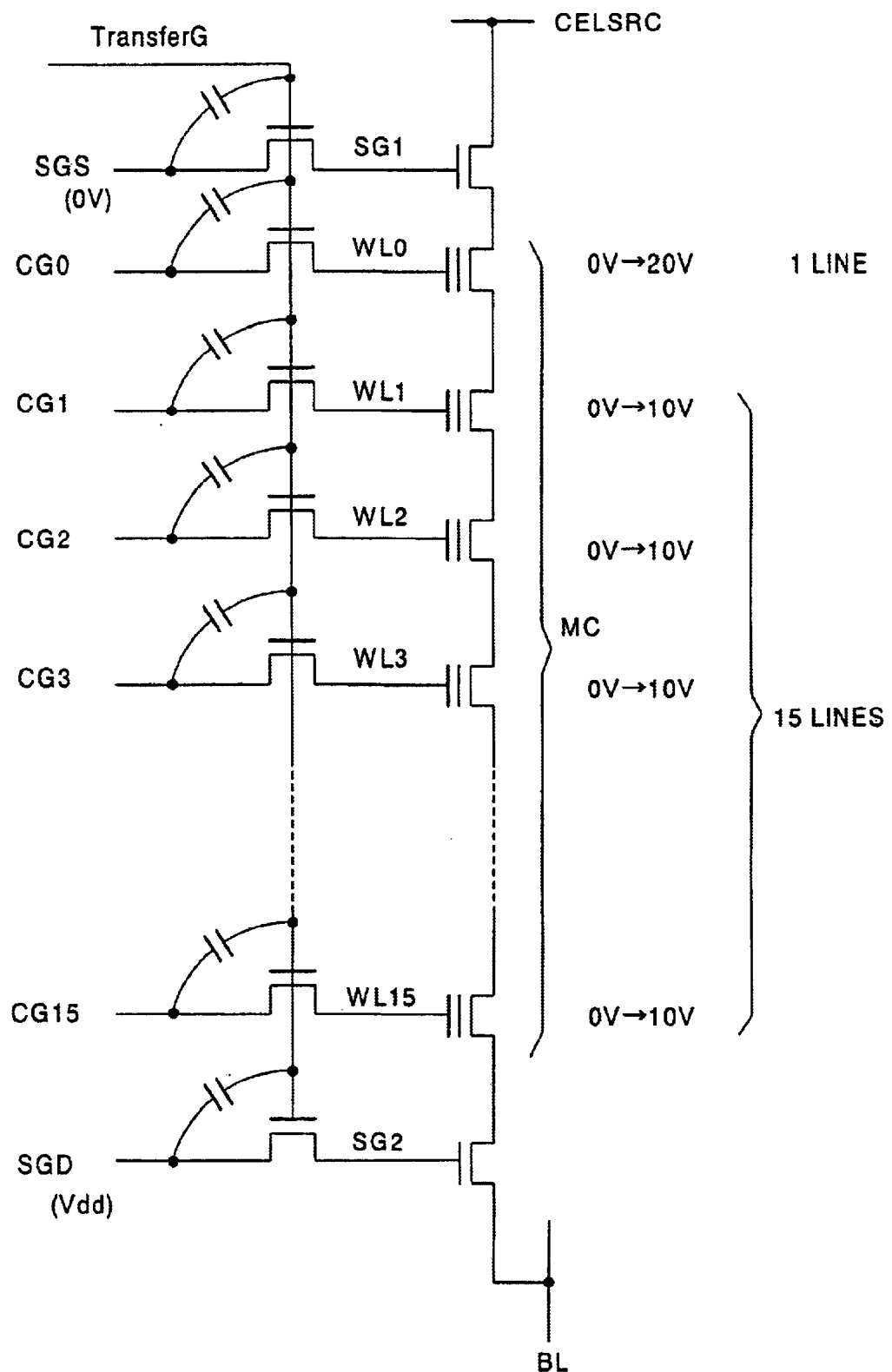
FIG. 7 is a circuit diagram showing a change in voltage when a normal program operation is executed to the memory cell array of the semiconductor memory device of the first embodiment.

Next, FIG. 7 shows coupling effect in the row decoder when the normal program operation is performed to the memory cell array. In this case, 20 V is applied to one word line WL0 to program data into the selected memory cell. The intermediate voltage of 10 V is applied to all the other word lines WL1 to WL15. It is possible to increase the voltage of Transfer G to some degree at the application of the voltage to these word lines by the coupling capacitance between a signal line of the gates Transfer G of the transfer transistors 3 and the respective CG lines and the respective word lines. This embodiment makes effective use of this effect.

In the semiconductor memory device of this embodiment, in the program operation of the NAND-type flash memory, a path for supplying the transfer voltage to transfer the program voltage to the word line is controlled so as to become floating in predetermined timing, whereby data can be programmed even if the transfer capability of the level shifter or a charge pump circuit provided in the row decoder is insufficient.

Consequently, even if deterioration in device characteristics occurs, this semiconductor memory device, as the operable semiconductor memory device, can increase the operation margin. As described above, in this embodiment, it becomes possible to apply the desired program voltage to the word line by switching the voltage of the control signal VRDEC from a state of supply of the signal VPGMH to a floating state when data is programmed.

Second Embodiment

Figure 8:
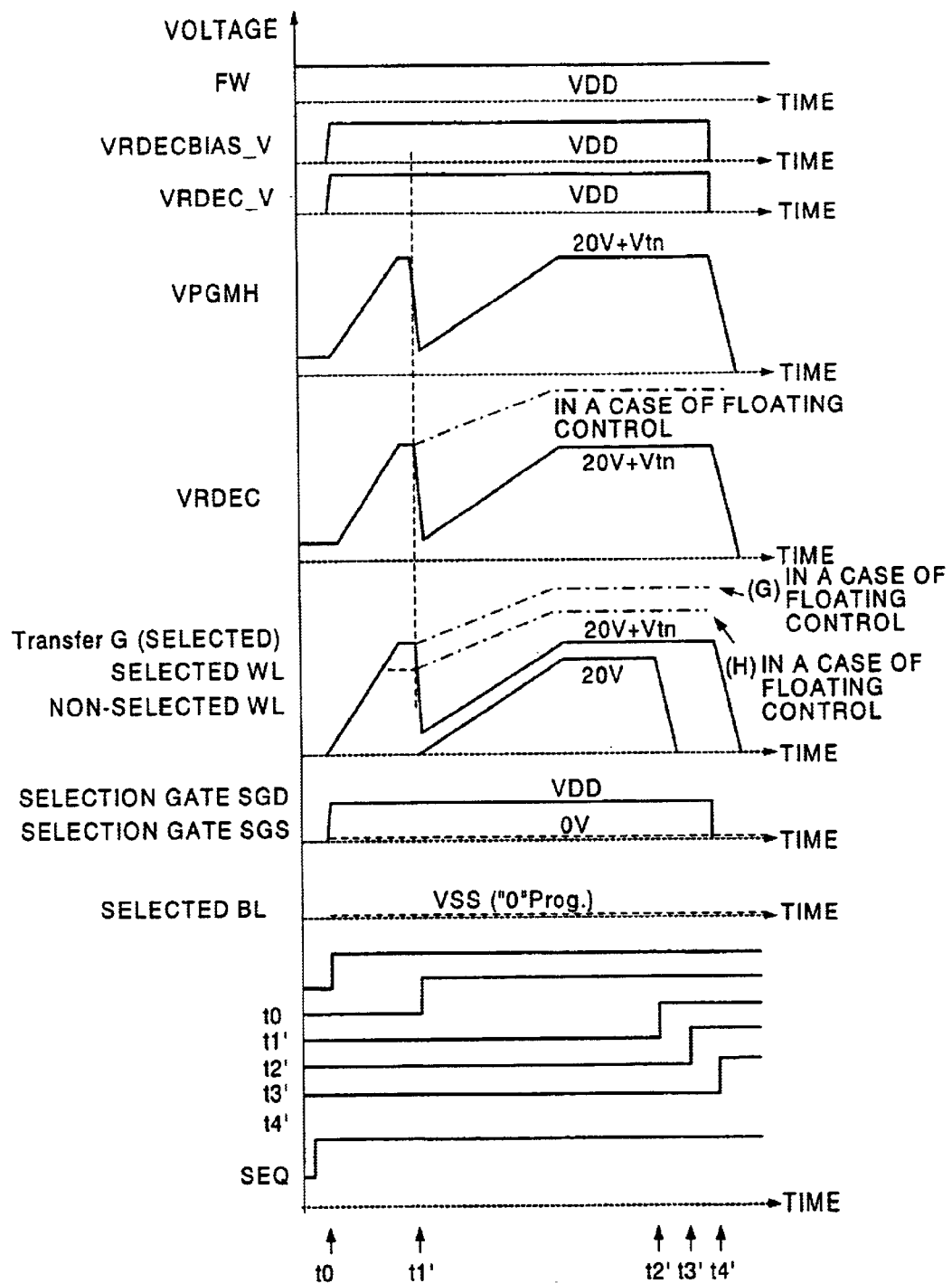
FIG. 8 is a timing chart showing a program operation in the case of a flash write of a semiconductor memory device of a second embodiment.

A semiconductor memory device of this embodiment has the following characteristics in addition to those of the semiconductor memory device of the first embodiment. FIG. 8 shows waveforms in a program operation for all memory cells in all blocks in the semiconductor memory device. In the first embodiment, it is explained that control for rendering the control signal VRDEC floating is performed in timing when the program voltage is applied to the word line. However, in the case of the program operation for all the blocks and all the memory cells (Flash Write), the operation of rendering the control signal VRDEC floating is undesirable. The semiconductor memory device of this embodiment prevents this undesirable operation.

First, a case where the control signal VRDEC is rendered floating in the flash write operation will be explained. When the program operation of the flash write starts at the time t0, the control signal VRDEC is charged to a voltage of VPCMH. At this time, all the block are in a selective state, and hence the load capacitance of the voltage VPGMH becomes large, but it is supposed that they are charged to the voltage of VPGMH by a time t1' as shown in FIG. 8. If the control for changing the control signal VRDEC from a state in which it is biased at the voltage of VPGMH to a floating state is performed at the time t1', all the word lines in a chip of the semiconductor memory device are charged to a voltage of VPGM from the time t1', whereby the load of the voltage VPGM markedly increases, and hence the level of the output voltage itself of the VPP pump circuit 30 is considerably lowered and a rise in word line voltage also becomes extremely slow. If the control signal VRDEC is made floating, this does not cause the lowering of the level as stated above.

As the voltages of all the word lines rise, the gate voltage Transfer G of the transfer transistors 3 rises by coupling among the CG lines, the word lines, and all the row decoders as stated above. At this time, the magnitude of a rise in the voltage of the gate voltage Transfer G of the transfer transistors 3 by coupling is very large since all the word lines in the NAND cell have the amplitude of the voltage VPGM. If the control signal VRDEC is floating, charge whose voltage is raised by the gate voltage Transfer G of the transfer transistors 3 of all the blocks flows thereinto, whereby the wiring voltage of the control signal VRDEC also rises greatly.

In the first embodiment, only charge whose voltage is raised by the gate voltage Transfer G of the transfer transistors 3 of one block flows into the control signal VRDEC, and consequently the voltage of the control signal VRDEC is held down. Accordingly, in a case where the gate voltage Transfer G of the transfer transistors 3 is charged to the same voltage VPGMH as the control signal VRDEC in all the row decoders by the time t1', a waveform G is obtained, hence the voltage of the gate voltage Transfer G of the transfer transistors 3 and the voltage of the control signal VRDEC greatly rise, and a voltage exceeding device withstand voltage is applied to the devices of the row decoder 10 and the VRDEC driver 20, whereby there is a possibility of causing the junction breakdown or degradation of the characteristics. For example, when the control signal VRDEC rises to the predetermined voltage 20 V+Vtn by the time t1' as shown by the waveform G, there is a possibility that the voltage rises to nearly 40 V if a leakage current is not taken into consideration. In actuality, before it reaches this voltage, discharge is performed by leakage from a spot with low junction withstand voltage or the like, but it is controversial in terms of device reliability to allow the operation in which the voltage rises to a voltage which is uncontrollable in terms of the circuit. Needless to say, destruction does not occur at 20 V as the normal word line voltage, but there arises a possibility that the devices are destroyed if the voltage rises by more than a margin at the time of device design.

When the charge level of Transfer G at the time t1' is low due to the operation margin of the level shifter of the row decoder, a waveform H whose voltage is lower than that of the waveform G is obtained, but whether the waveform G or the waveform H is obtained is a problem in terms of the operation margin determined by the capability of the level shifter, and hence it is difficult to control them separately. As stated above, a rise in the voltage of the selected word line is slow, but it rises after the time t1'.

Accordingly, to prevent the voltage from rising too high as shown by the waveform G and leading to device destruction, in the flash write, data is programmed while the control signal VRDECBIAS_V is maintained at "H" level. Namely, the voltage VPGMH continues being supplied to the control signal VRDEC without the control signal VRDEC being rendered floating at the time t1'. In this case, measures against the problem in terms of the operation margin of the level shifter of the row decoder are not taken, but it becomes possible to cope with the prevention of device destruction.

In order not to render the control signal VRDEC floating in the flash write, the control signal VRDECBIAS_V is controlled by the conditions of the flash write. Namely, when all the blocks are selected, or all the blocks are selected and all pages in NANDs are brought into a selective state, the control signal VRDECBIAS_V is maintained at "H" level.

Figure 9:
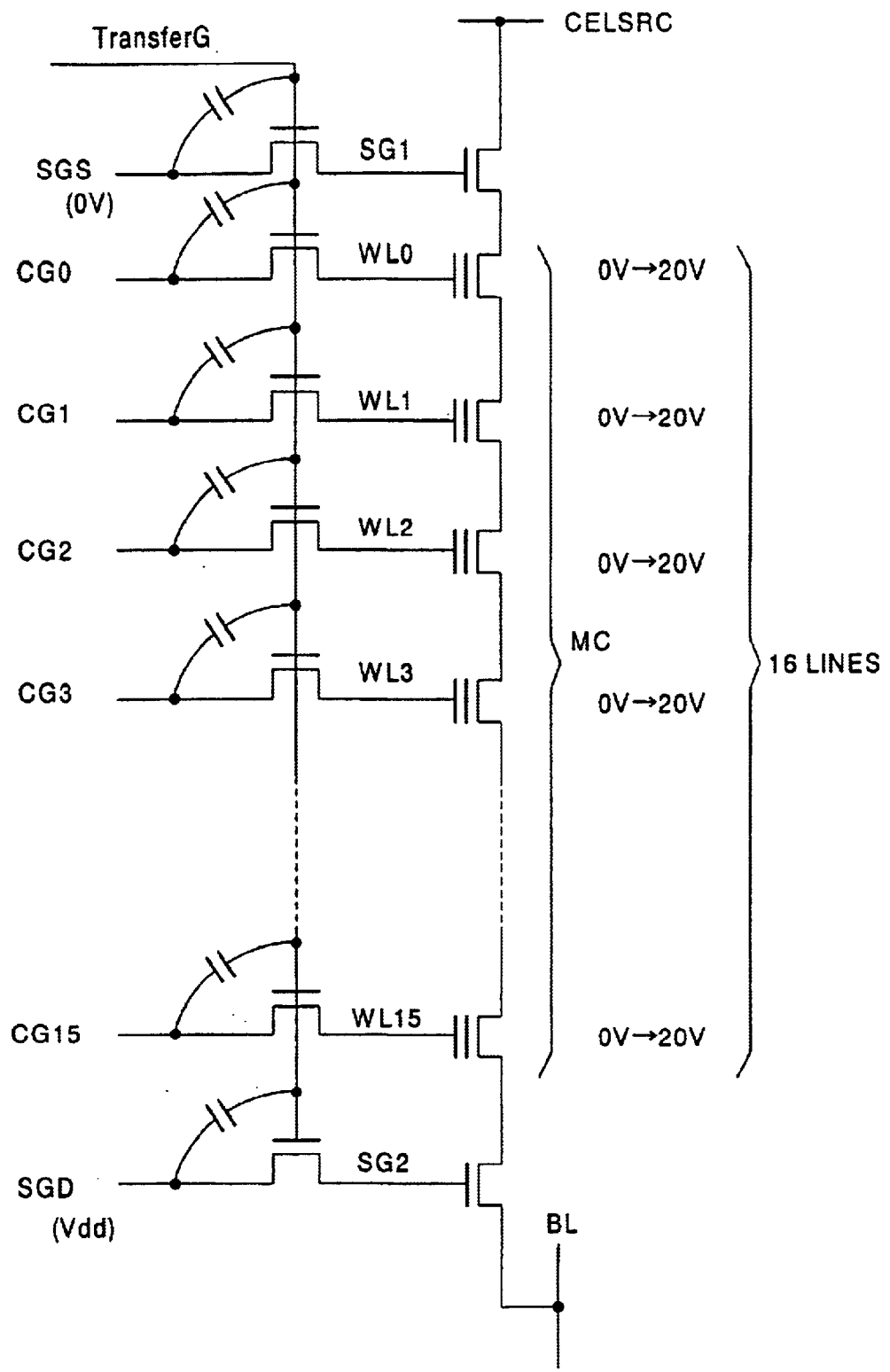
FIG. 9 is a circuit diagram showing a change in voltage when the flash write is performed to a memory cell array of the semiconductor memory device of the second embodiment.

Next, FIG. 9 shows a circuit diagram representing changes in voltage when the flash write is performed to the memory cell array. In this case, 20 V is applied to all the word lines in order to program data to all the memory cells. Coupling occurs between the signal line of Transfer G and each of the word lines, and coupling effect increases as compared with that in the normal program operation because the influence of 20 V which is the voltage of 16 word lines is large.

Figure 10:
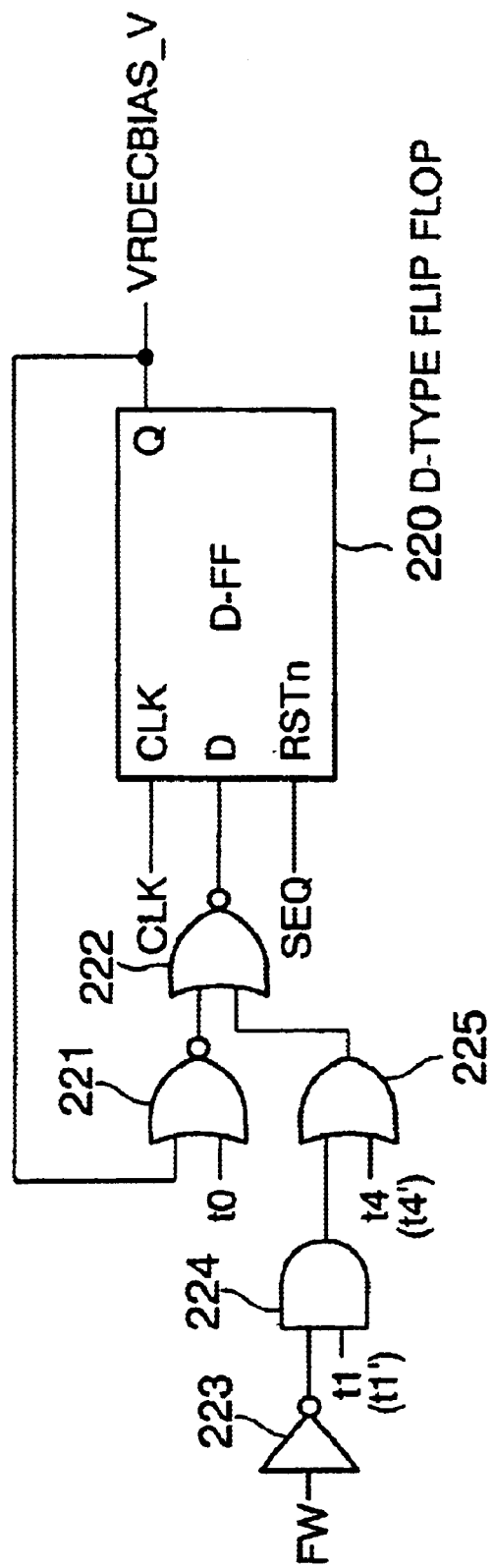
FIG. 10 is a logic circuit diagram showing a VRDECBIAS_V control circuit of the semiconductor memory device of the second embodiment.
Figure 11:
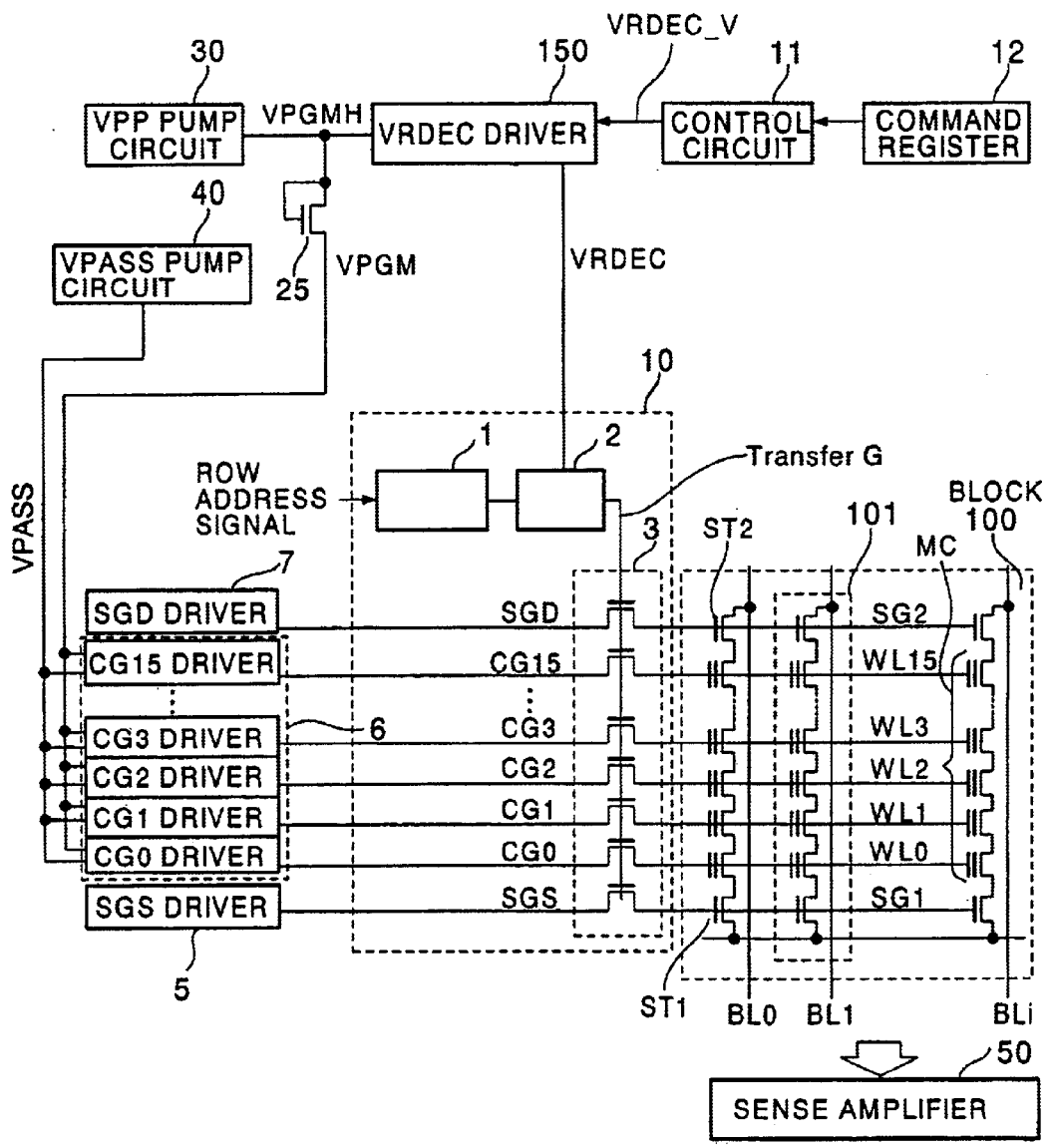
FIG. 11 is a block diagram showing a related semiconductor memory device.
Figure 12:
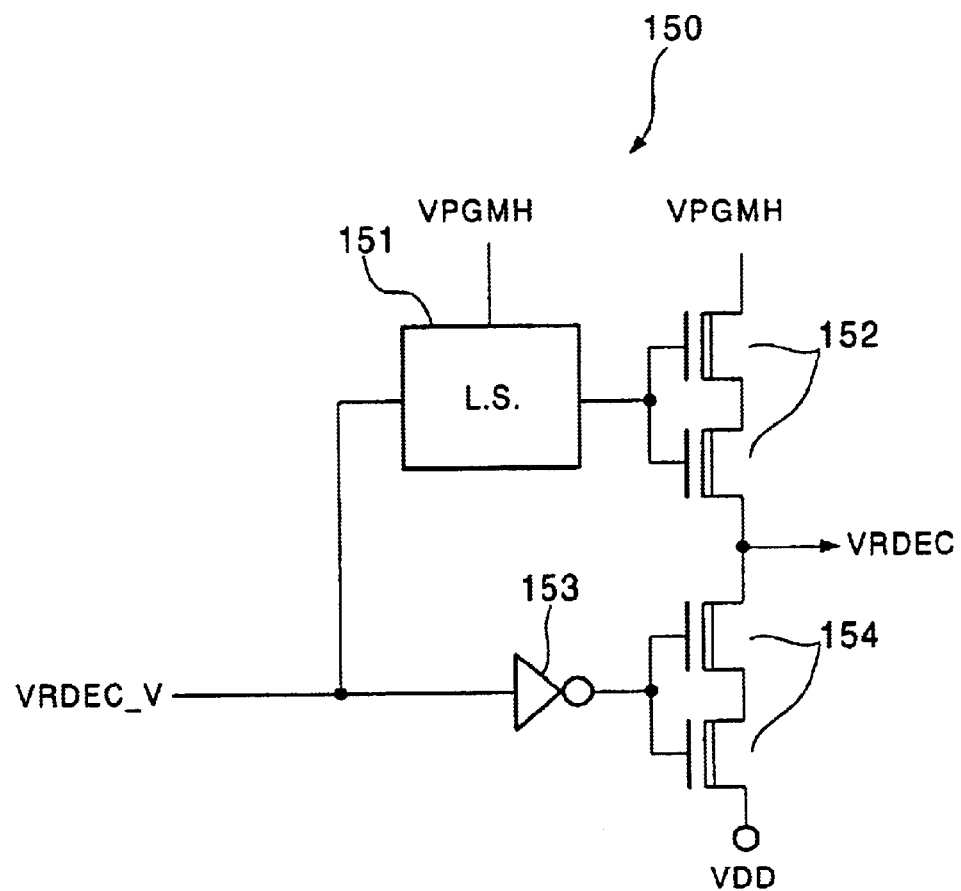
FIG. 12 is a circuit diagram showing a related VRDEC driver.
Figure 13:
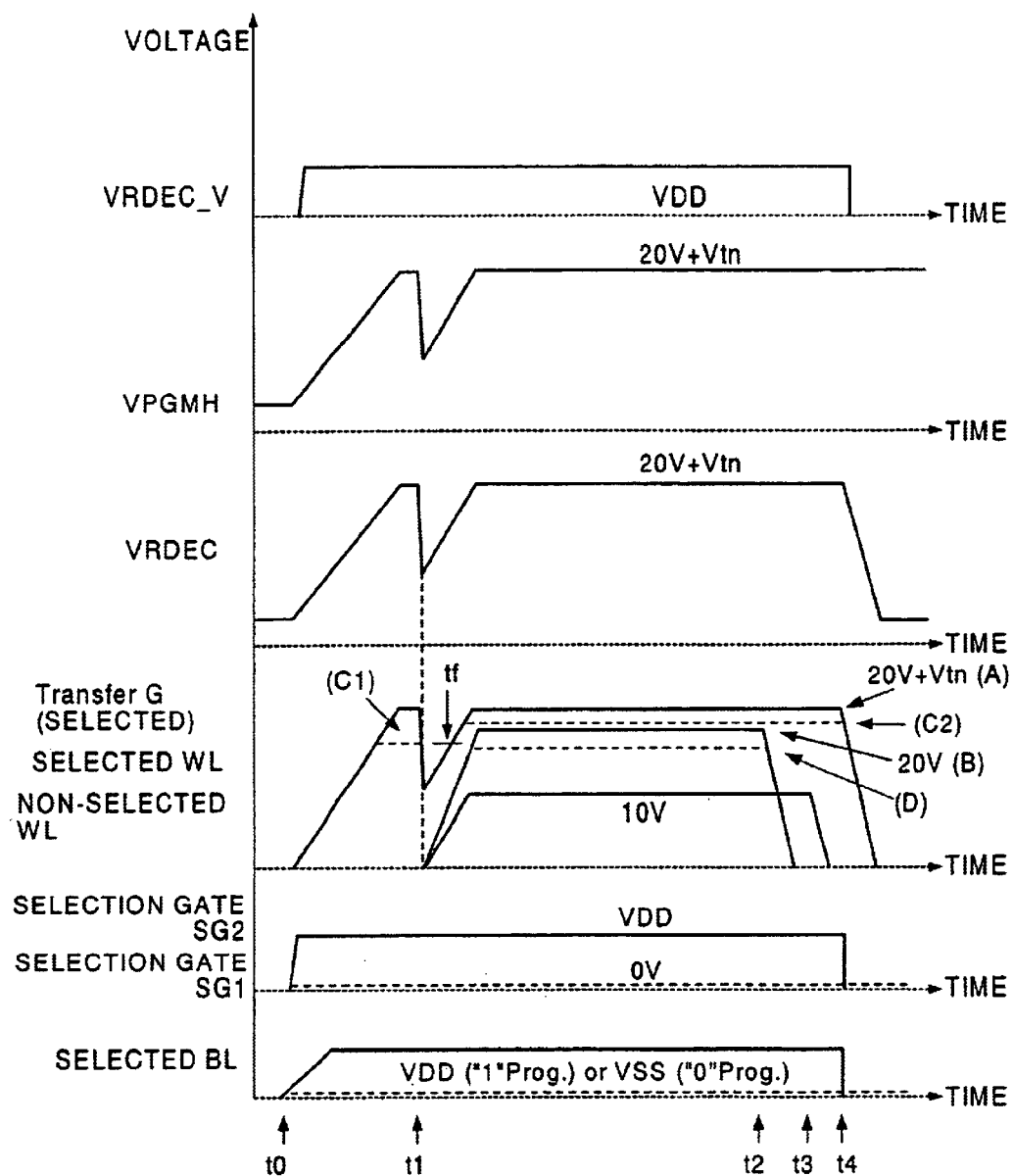
FIG. 13 is a timing chart showing a program operation of the related semiconductor memory device.

FIG. 10 shows a control circuit of the control signal VRDECBIAS_V in this embodiment. As compared with the same circuit of the first embodiment shown in FIG. 5B, an inverter 223, an AND circuit 224, and an OR circuit 225 are added. A signal FW to be inputted to the inverter 223 is a signal which goes to "H" level according to flash write conditions (see FIG. 8). An output of this signal FW is determined by a command input which designates the program operation or the like. When the program operation is started, irrespective of the signal FW, the control signal VRDECBIAS_V goes to "H" level. Thereafter, when the signal FW is at "L" level, for example, in a normal page program operation, the control signal VRDECBIAS_V goes to "L" level by a signal of the time t1 inputted to the AND circuit 224. In this case, the control signal VRDECBIAS_V has the waveform such as shown in FIG. 4. On the other hand, when the signal FW is at "H" level, the control signal VRDECBIAS_V goes to "L" level by a signal of the time t4 inputted to the OR circuit 225. In this case, the control signal VRDECBIAS_V has a waveform such as shown in FIG. 8. In FIG. 10, the signals t1 and t4 each corresponding to a time become different times t1' and t4' in the case of the flash write.

Thus, it is possible to perform such control as to render the node VRDEC floating in the normal program operation and perform such control so as not to render the node VRDEC floating in the flash write.

Incidentally, in this second embodiment, it is explained that the control signal VRDEC is not rendered floating in the program operation when all the blocks and all the memory cells are selected, but the condition under which the node VRDEC is not rendered floating is not limited to this, and it can be also applied to the cases where a predetermined number of word lines in a block are selected simultaneously, and a predetermined number of word lines in a block are selected simultaneously and a predetermined number, more than one, of blocks are selected simultaneously.

In addition to obtaining the same effect as in the first embodiment, this embodiment can prevent device degradation in the flash write. Namely, there can be provided a semiconductor memory device in which the voltage of the control signal VRDEC is set to a floating state in the normal program operation, and on the other hand, in the flash write, control during the program operation is switched so that a predetermined voltage continues being applied while data is programmed, whereby a desired program voltage is applied to the word lines and device destruction is prevented.

What is claimed is:

1. A semiconductor memory device, comprising:
   a memory cell array in which electrically programmable memory cells are arranged in a matrix form, the memory cells being connected to word lines;
   a first voltage generating circuit which generates a first voltage;
   a second voltage generating circuit which generates a second voltage using the first voltage, the second voltage being lower than the first voltage;
   a word line selecting circuit which selects at least one of the word lines of the memory cells in accordance with an inputted address;
   a word line voltage supplying circuit which supplies the second voltage to the selected word line through the word line selecting circuit; and
   a transfer voltage supplying circuit which supplies the first voltage to the word line selecting circuit and stops supplying the first voltage so as to be in a floating state before transferring the second voltage from the word line voltage supplying circuit to the selected word line, in an operation in which the second voltage is supplied to the selected word line after the first voltage is supplied to the word line selecting circuit.

2. The semiconductor memory device as set forth in claim 1, wherein the word line selecting circuit is plural.

3. The semiconductor memory device as set forth in claim 2, wherein the transfer voltage supplying circuit continues to supply the first voltage, in an operation in which the plurality of word line selecting circuits are simultaneously selected and the second voltage is supplied from the word line voltage supplying circuit to the selected word line after the first voltage is supplied from the transfer voltage supplying circuit to the word line selecting circuit.

4. The semiconductor memory device as set forth in claim 3, wherein the second voltage is generated by dropping the first voltage in the second voltage generating circuit.

5. The semiconductor memory device as set forth in claim 4, wherein the word line voltage supplying circuit is plural.

6. The semiconductor memory device as set forth in claim 5, wherein the memory cells form a plurality of NAND-type cells in the memory cell array.

7. The semiconductor memory device as set forth in claim 1, wherein the second voltage is generated by dropping the first voltage in the second voltage generating circuit.

8. The semiconductor memory device as set forth in claim 7, wherein the word line selecting circuit comprises first transfer transistors which transfer the second voltage to the word lines,
   a signal line of the first voltage from the transfer voltage supplying circuit goes to a first floating voltage in the floating state after stopping supply of the first voltage, in a normal write operation to the memory cell array, and
   gates of the first transfer transistors go to a second floating voltage in the floating state, in the normal write operation to the memory cell array.

9. The semiconductor memory device as set forth in claim 8, wherein a difference between the first voltage generated by the first voltage generating circuit and the second voltage generated by the second voltage generating circuit is equal to or higher than a threshold voltage of the first transfer transistor of the word line selecting circuit.

10. The semiconductor memory device as set forth in claim 9, wherein the word line selecting circuit further comprises a second transfer transistor which transfers the first voltage to the gates of the first transfer transistors, and
    a difference between the second floating voltage and the first floating voltage is equal to or lower than a threshold voltage of the second transfer transistor.

* * * * *